(12) United States Patent
Choi

(10) Patent No.: US 10,409,718 B2
(45) Date of Patent: Sep. 10, 2019

(54) MEMORY SYSTEM AND OPERATING METHOD THEREOF

(71) Applicant: SK hynix Inc., Gyeonggi-do (KR)

(72) Inventor: An Ho Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 232 days.

(21) Appl. No.: 15/148,942

(22) Filed: May 6, 2016

(65) Prior Publication Data

US 2017/0199676 A1    Jul. 13, 2017

(30) Foreign Application Priority Data

Jan. 12, 2016  (KR) .................... 10-2016-0003547

(51) Int. Cl.
  *G06F 3/06*     (2006.01)
  *G11C 16/14*    (2006.01)
  *G06F 12/02*    (2006.01)
  *G11C 16/34*    (2006.01)

(52) U.S. Cl.
  CPC ...... *G06F 12/0253* (2013.01); *G06F 12/0246* (2013.01); *G11C 16/3495* (2013.01); *G06F 2212/1044* (2013.01); *G06F 2212/7201* (2013.01); *G06F 2212/7205* (2013.01); *G11C 16/14* (2013.01)

(58) Field of Classification Search
  CPC ............................ G06F 12/0246; G06F 3/0608
  See application file for complete search history.

(56) References Cited

U.S. PATENT DOCUMENTS

| | | | | |
|---|---|---|---|---|
| 2008/0219053 A1* | 9/2008 | Kim | ................... | G11C 16/0483 365/185.11 |
| 2010/0169558 A1* | 7/2010 | Honda | ................... | G06F 9/4403 711/103 |
| 2010/0235713 A1* | 9/2010 | Lee | ...................... | G06F 11/1072 714/763 |
| 2011/0219173 A1* | 9/2011 | Morita | .................... | G06F 12/00 711/103 |
| 2013/0080730 A1* | 3/2013 | Kim | ..................... | G06F 12/0246 711/203 |
| 2014/0089565 A1* | 3/2014 | Lee | ......................... | G06F 3/061 711/103 |
| 2014/0226404 A1* | 8/2014 | Lee | ........................ | G11C 16/16 365/185.11 |
| 2015/0187430 A1* | 7/2015 | Suzuki | .............. | G11C 16/3495 347/5 |
| 2016/0070656 A1* | 3/2016 | Babu | ....................... | G06F 8/654 711/163 |
| 2016/0306723 A1* | 10/2016 | Lu | ........................ | G06F 11/2094 |

FOREIGN PATENT DOCUMENTS

| | | |
|---|---|---|
| KR | 100739256 | 7/2007 |
| KR | 1020150091685 | 8/2015 |

* cited by examiner

*Primary Examiner* — Charles Rones
*Assistant Examiner* — Tian-Pong Chang
(74) *Attorney, Agent, or Firm* — IP & T Group LLP

(57) ABSTRACT

There are provided a memory system including a semiconductor memory device and a controller and an operating method thereof. A memory system having an extended storage area includes a semiconductor memory device including a plurality of memory blocks, and a controller for controlling the semiconductor memory device. In the memory system, the semiconductor memory device stores system information required to drive the semiconductor memory device and the controller in one memory block among the plurality of memory blocks.

15 Claims, 11 Drawing Sheets

MEMORY SYSTEM AND OPERATING METHOD THEREOF

CROSS-REFERENCE TO RELATED APPLICATION

The present application claims a priority to Korean patent application number 10-2016-0003547 filed on Jan. 12, 2016, the disclosure of which is incorporated herein by reference in its entirety.

BACKGROUND

1. Field

Embodiments of the present disclosure relate to a memory system and an operating method thereof.

2. Description of the Related Art

A semiconductor memory device is a memory device implemented using a semiconductor such as silicon (Si), germanium (Ge), gallium arsenide (GaAs), or indium phosphide (InP). A semiconductor memory device is generally classified into a volatile memory device and a nonvolatile memory device.

A volatile memory loses stored data when a power supply is cut off. Examples of the volatile memory include a static random access memory (SRAM), a dynamic RAM (DRAM), a synchronous DRAM (SDRAM), and the like. The nonvolatile memory is a memory device which retains stored data even when a power supply is cut off. Examples of the nonvolatile memory include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. Flash memory is generally classified into a NOR type flash memory and a NAND type flash memory.

SUMMARY

Embodiments of the present disclosure provide a memory system having an extended storage area and an operating method thereof.

According to an aspect of the present disclosure, there is provided a memory system including: a semiconductor memory device configured to include a plurality of memory blocks; and a controller configured to control the semiconductor memory device, wherein the semiconductor memory device stores system information required to drive the semiconductor memory device and the controller in one memory block among the plurality of memory blocks, and erase a portion of the one memory block and then updates a portion of the system information in response to a request of the controller.

According to an aspect of the present disclosure, there is provided a method of operating a memory system including a semiconductor memory device for storing system information in one memory block among a plurality of memory blocks and a controller for controlling the semiconductor memory device, the method including: storing an accumulated number of updating times by accumulating a number of updating times whenever a portion or the whole of the system information is updated; and if the accumulated number of updating times exceeds a predetermined critical value, performing a system block changing operation of changing a configuration of a system block in which the system information is stored.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the relevant art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
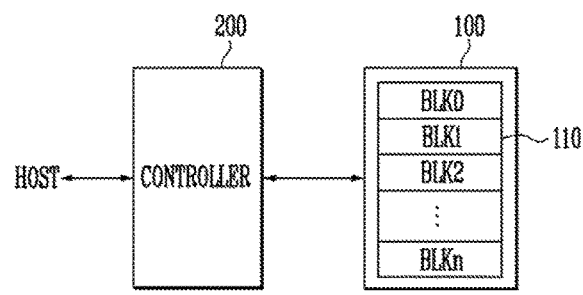
FIG. 1 is a block diagram illustrating a configuration of a memory system including a host, a controller and a semiconductor memory device.

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

The embodiments according to the concept of the present disclosure can be variously modified and have various shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

Hereinafter, exemplary embodiments of the present disclosure will be described in detail with reference to the accompanying drawings.

FIG. 1 is a block diagram illustrating a configuration of a memory system 10.

Referring to FIG. 1, the memory system 10 may include a semiconductor memory device 100 and a controller 200 and a host HOST.

The semiconductor memory device 100 may be a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. Also, the semiconductor memory device 100 of the present disclosure may be implemented in a three-dimensional (3D) array structure. The present disclosure may be applied not only to a flash memory device in which a charge storage layer is formed by a conductive floating gate (FG) but also to a charge trap flash (CTF) memory in which a charge storage layer is formed of an insulation film.

The semiconductor memory device 100 receives a command and an address from the controller 200 through a channel, and accesses an area selected by the address in a memory cell array. That is, the semiconductor memory device 100 performs an internal operation corresponding to the command with respect to the area selected by the address.

For example, the semiconductor memory device 100 may perform a program operation, a read operation, and an erase operation. In the program operation, the semiconductor memory device 100 may program data in the area selected by the address. In the read operation, the semiconductor memory device 100 may read data from the area selected by the address. In the erase operation, the semiconductor memory device 100 may erase data stored in the area selected by the address.

A memory cell array 110 of the semiconductor memory device 100 may include a plurality of memory blocks BLK0 to BLKn. Each of the plurality of memory blocks BLK0 to BLKn may include a plurality of memory cells. In an embodiment, the plurality of memory cells may be nonvolatile memory cells. The plurality of memory blocks BLK0 to BLKn may be classified into a main block, a spare block, an extra block, and the like according to kinds of data to be stored.

The controller 200 controls overall operations of the semiconductor memory device 100. Specifically, the controller 200 may control the semiconductor memory device 100 to perform at least one of a program operation, read operation, and erase operation. In the program operation, the controller 200 may provide the semiconductor memory device 100 with a program command, an address, and data through the channel. In the read operation, the controller 200 may provide the semiconductor memory device 100 with a read command and an address through the channel. In the erase operation, the controller 200 may provide the semiconductor memory device 100 with an erase command and an address through the channel.

The controller 200 accesses the semiconductor memory device 100 in response to a request from a host. The controller 200 provides an interface for communicating with the host and the semiconductor memory device 100. The controller 200 drives firmware for controlling the semiconductor memory device 100.

Meanwhile, system information required for the controller 200 to control the semiconductor memory device 100 in response to the request from the host may be stored in the plurality of memory blocks BLK0 to BLKn of the memory cell array 110 in the semiconductor memory device 100. The system information will be described in detail with reference to FIG. 4.

Figure 2:
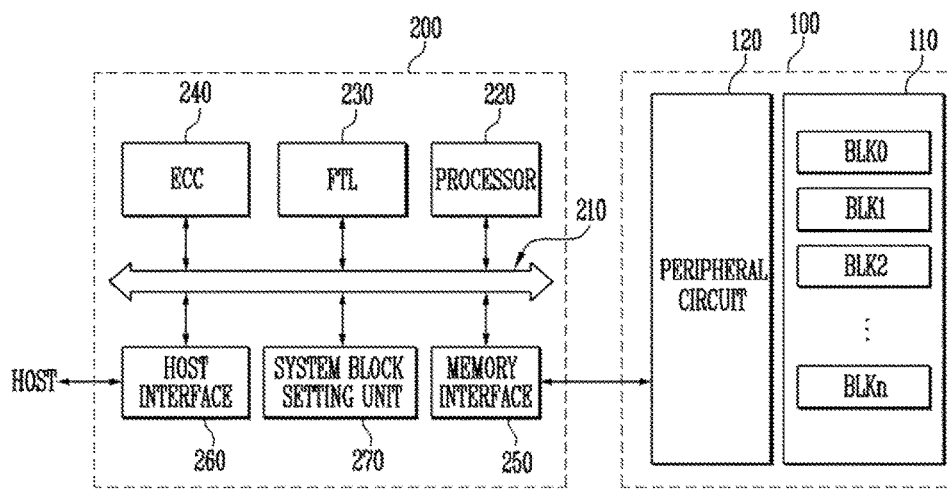
FIG. 2 is a block diagram illustrating a structure of a controller of FIG. 1.

FIG. 2 is a block diagram illustrating a structure of the controller 200 of FIG. 1.

Referring to FIG. 2, the controller 200 is coupled to a host and a semiconductor memory device 100. The controller 200 accesses the semiconductor memory device 100 in response to a request from the host. For example, the controller 200 controls a read operation, a program operation, and an erase operation of the semiconductor memory device 100. The controller 200 provides an interface between the semiconductor memory device 100 and the host. The controller 200 drives firmware for controlling the semiconductor memory device 100. The semiconductor memory device 100 includes a flash memory device.

The controller 200 may include an internal bus 210, a processor 220, a flash translation layer (FTL) 230, an error correction code (ECC) block 240, a memory interface 250, a host interface 260, and a system block setting unit 270.

The internal bus 210 provides a channel between components of the controller 200. As an embodiment, the internal bus 210 may be a common channel for transmitting a command and data. In various embodiments, the internal bus 210 may include a command channel for transmitting a command and a data channel for transmitting data.

The processor 220 controls overall operations of the controller 200. The processor 220 may execute software and firmware, driven in the controller 200.

The FTL 230 may include any suitable means for controlling the semiconductor memory device 100.

The semiconductor memory device 100 may be a flash memory device. The flash memory device has different features from a typical memory such as a dynamic random access memory (DRAM). Specifically, the flash memory device has a feature of erase before write. The unit of a read operation and a program operation of the flash memory device is different from the unit of an erase operation of the flash memory device. The read operation and program operation of the flash memory device may be performed in a unit of a page, while the erase operation of the flash memory device may be performed in a unit of a block. An erase operation may be performed by a partial erase method of erasing only a portion of one block. In an embodiment, system information may be updated using a partial erase operation of erasing only a portion of one block without erasing the entire one block. The time required for an erase operation may be different from the rime required for a program, and read operation.

When the host accesses the semiconductor memory device 100, the FTL 230 provides various control means based on the features of the flash memory device as described above. For example, the FTL 230 provides a means for translating a logical address received from the host into a physical address of the flash memory device. The FTL 230 maintains, as a table, information on a mapping relation between the logical address and the physical address. The FTL 230 provides a means for controlling numbers of program and erase times of memory blocks of the semiconductor memory device 100 to be equalized. For example, the FTL 230 may provide a wear leveling means to prevent non-uniform wear occurring between the memory blocks of the semiconductor memory device. The FTL 230 provides a means for minimizing the number of erase times of the semiconductor memory device 100. For example, the FTL 230 provides a control means including merge, garbage collection, copy-back, etc. for minimizing the number of erase times of the semiconductor memory device 100.

The ECC block 240 may detect and correct an error of data read from the semiconductor memory device 100.

The memory interface 250 may include a protocol for communicating with the semiconductor memory device 100. For example, the memory interface 250 may include at least one of flash interfaces such as a NAND interface and a NOR interface.

The host interface 260 includes a protocol for performing data exchange between the host and the controller 200. As an embodiment, the controller 200 is configured to communicate with the external (host) through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, and the like.

Although not shown in this figure, the controller 200 may further include a storage unit. The storage unit may be used as at least one of an operation memory of the processor 220, a buffer memory between the semiconductor memory device 100 and the host, and a cache memory between the semiconductor memory device 100 and the host. Also, the storage unit may be used as a buffer for arbitrarily storing data input from the semiconductor memory device 100. As an embodiment, the storage unit may include at least one of various randomly accessible memories such as a static RAM (SRAM), a dynamic RAM (DRAM), a synchronous DRAM (SDRAM), a phase-change RAM (PRAM), a magnetic RAM (MRAM), a resistive RAM (RRAM), a ferroelectric RAM (FRAM), a NOR flash memory, and the like.

The semiconductor memory device 100 includes a memory cell array 110 and a peripheral circuit 120. The controller 200 may store data in the memory cell array 110, or read or erase data stored in the memory cell array 110 through the peripheral circuit 120. Each of the components of the semiconductor memory device 100 will be described in detail later with reference to FIG. 3.

The system block setting unit 270 may store system information in the memory cell array 110 of the semiconductor memory device 110 or may update the stored system information. In an embodiment, the system block setting unit 270 may change a memory block in which system information is to be stored, based on a number of update times of the system information stored in the memory block. Alternatively, when the number of updates of the system information in a system memory block exceeds a threshold number, then the system block setting unit 270 may control the semiconductor memory device 100 to perform a system block changing operation for changing the storage position of system information in a memory block (hereinafter, referred to as a system block) in which the system information is stored.

The system block setting unit 270 may count a number of update times of memory cells in a system block. If the accumulated number of update times exceeds a threshold value, the system block setting unit 270 may perform a system block changing operation. The system block setting unit 270 may include a counter circuit for counting a number of update times of memory cells in a system block. The system block changing operation may be performed on the basis of a block unit or a page unit.

In various embodiments, a controller 200 may be coupled to a plurality of semiconductor memory devices 100.

Figure 3:
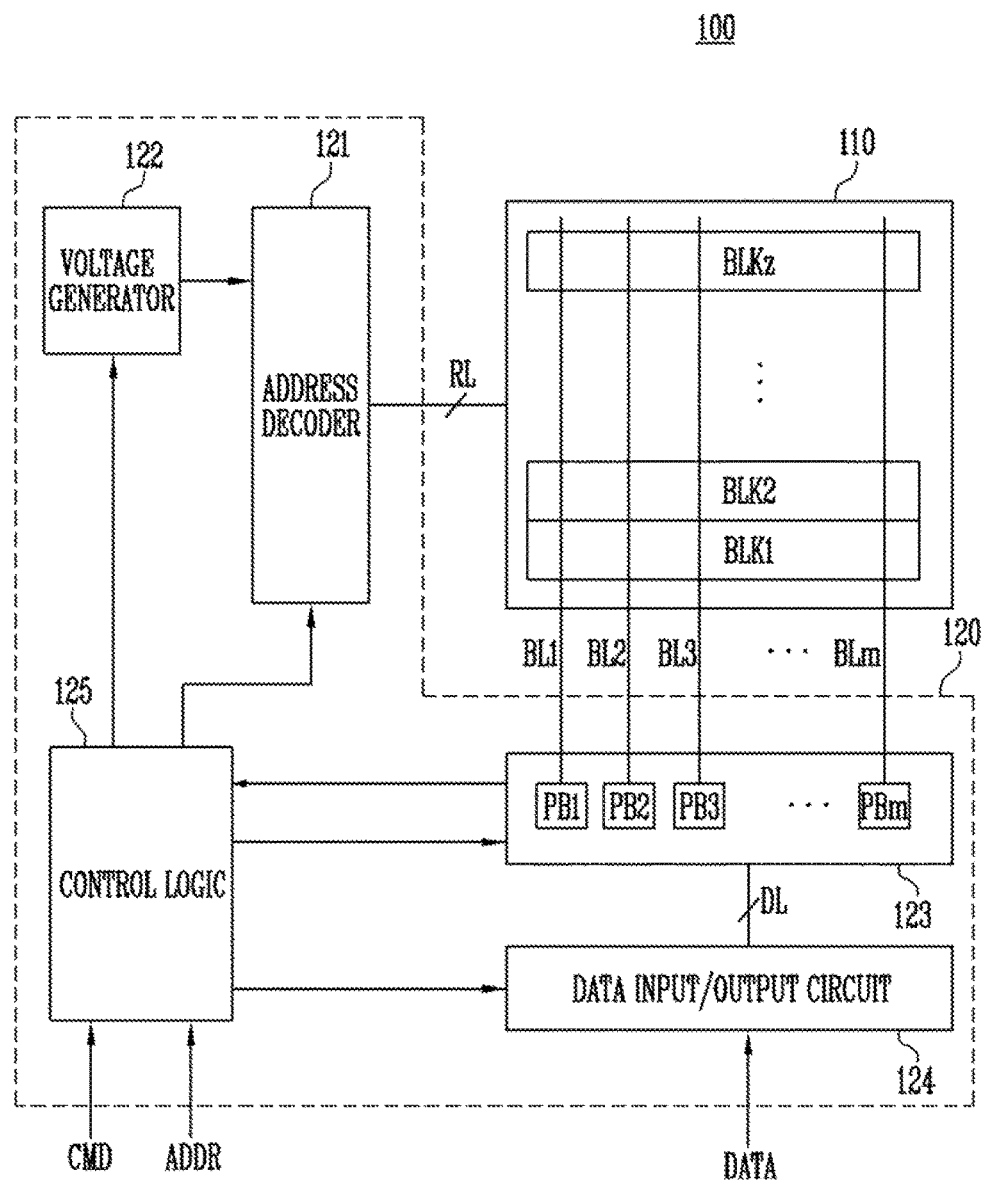
FIG. 3 is a block diagram illustrating a structure of a semiconductor memory device of FIG. 1.

FIG. 3 is a block diagram illustrating a structure of the semiconductor memory device 100 of FIG. 1.

Referring to FIG. 3, the semiconductor memory device 100 may include a memory cell array 110 and a peripheral circuit 120.

The memory cell array 110 may include a plurality of memory blocks BLK1 to BLKz. The plurality of memory blocks BLK1 to BLKz are coupled to an address decoder 121 of the peripheral circuit 120 through row lines RL, and are coupled to a read/write circuit 123 through bit lines BL1 to BLm. Each of the plurality of memory blocks BLK1 to BLKz includes a plurality of memory cells. As an embodiment, the plurality of memory cells may be nonvolatile memory cells.

The plurality of memory cells included in the memory cell array 110 may be divided into a plurality of blocks according to their use. System information as various setting information required to control the semiconductor memory device 100 may be stored in the plurality of blocks.

Each of first to zth memory blocks BLK1 to BLKz may include a plurality of cell strings. The first to mth cell strings are coupled to first to mth bit lines, respectively. Each of the first to mth cell strings may include a drain select transistor, a plurality of memory cells coupled in series, and a source select transistor. The drain select transistor is coupled to a drain select line. First to nth memory cells are coupled to first to nth word lines, respectively. The source select transistor is coupled to a source select line. A drain of the drain select transistor is coupled to a corresponding bit line. The drain select transistors of the first to mth cell strings are coupled to the first to mth bit lines BL1 to BLm, respectively. A source of the source select transistor is coupled to a common source line. As an embodiment, the common source line may be commonly coupled to the first to zth memory blocks BLK1 to BLKz. The drain select line, the first to nth word lines, and the source select line are included in the row lines RL. The drain select line, the first to nth word lines, and the source select line are controlled by the address decoder 121. The common source line is controlled by a control logic 125. The first to mth bit lines BL1 to BLm are controlled by the read/write circuit 123.

The peripheral circuit 120 may include the address decoder 121, a voltage generator 122, the read/write circuit 123, a data input/output circuit 124, and the control logic 125.

The address decoder 121 is coupled to the memory cell array 110 through the row lines RL. The address decoder 121 operates in response to control of the control logic 125. The address decoder 121 receives an address ADDR through the control logic 125.

As an embodiment, the program and read operations of the semiconductor memory device 100 may be performed in a unit of a page.

In the program and read operations, the address ADDR received from the control logic 125 may include a block address and a row address. The address decoder 121 may decode the block address in the received address ADDR. The address decoder 121 selects one memory block among the memory blocks BLK1 to BLKz according to the decoded block address.

The address decoder 121 may decode the row address in the received address ADDR. The address decoder 121 selects one word line of the selected memory block by applying voltages provided from the voltage generator 122 according to the decoded row address.

In the erase operation, the address ADDR may include a block address. The address decoder 121 may decode the block address and select one memory block according to the decoded block address. The erase operation may be performed on the whole or a portion of the selected memory block.

In a partial erase operation, the address ADDR may include block and row addresses. The address decoder 121 selects one memory block among the memory blocks BLK1 to BLKz according to the decoded block address.

The address decoder 121 may decode row addresses in the received address ADDR. The address decoder 121 selects at least one word line of the selected memory block by applying voltages provided from the voltage generator 122 to the row lines RL according to the decoded row addresses.

As an embodiment, the address decoder 121 may include a block decoder, a word line decoder, an address buffer, and the like.

The voltage generator 122 generates a plurality of voltages by using an external power voltage supplied to the semiconductor memory device 100. The voltage generator 122 operates in response to control of the control logic 125.

As an embodiment, the voltage generator 122 may generate an internal power voltage by regulating the external power voltage. The internal power voltage generated by the voltage generator 122 is used as an operation voltage of the semiconductor memory device 100.

As an embodiment, the voltage generator 122 may generate a plurality of voltages by using the external power voltage or the internal power voltage. For example, the voltage generator 122 may include a plurality of pumping capacitors for receiving the internal power voltage, and may generate a plurality of voltages by selectively activating the plurality of pumping capacitors in response to control of the control logic 125. The plurality of generated voltages are applied to selected word lines by the address decoder 121.

In the program operation, the voltage generator 122 may generate a high-voltage program pulse and a pass pulse lower than the program pulse. In the read operation, the voltage generator 122 may generate a read voltage and a pass voltage higher than the read voltage. In the erase operation, the voltage generator 122 may generate an erase voltage.

The read/write circuit 123 may include a first to mth page buffers PB1 to PBm. The first to mth page buffers PB1 to PBm are coupled to the memory cell array 110 through the respective first to mth bit lines BL1 to BLm. The first to mth page buffers PB1 to PBm operate in response to control of the control logic 125.

The first to mth page buffers PB1 to PBm communicate data with the data input/output circuit 124. In the program operation, the first to mth page buffers PB1 to PBm receive data DATA to be stored through the data input/output circuit 124 and data lines DL.

In the program operation, the first to mth page buffers PB1 to PBm may transmit, to selected memory cells, the data DATA to be stored, which is received through the data input/output circuit 124, when a program pulse is applied to a selected word line. The memory cells of the selected page are programmed according to the transmitted data DATA. A memory cell coupled to a bit line to which a program permission voltage (e.g., a ground voltage) may have an increased threshold voltage. The threshold voltage of a memory cell coupled to a bit line to which a program prohibition voltage (e.g., a power voltage) may be maintained. In a program verify operation, the first to mth page buffers PB1 to PBm read page data from the selected memory cells through the bit lines BL1 to BLm.

In the read operation, the read/write circuit 123 reads data DATA from memory cells of a selected page through the bit lines BL and outputs the read data DATA to the data input/output circuit 124. In the erase operation, the read/write circuit 123 may float the bit lines BL.

As an embodiment, the read/write circuit 123 may include a column select circuit.

The data input/output circuit 124 is coupled to the first to mth page buffers PB1 to PBm through the data lines DL. The data input/output circuit 124 operates in response to control of the control logic 125. In the program operation, the data input/output circuit 124 receives data DATA to be stored from an external controller (not shown).

The control logic 125 is coupled to the address decoder 121, the voltage generator 122, the read/write circuit 123, and the data input/output circuit 124. The control logic 125 may control overall operations of the semiconductor memory device 100. The control logic 125 receives a command CMD and an address ADDR from the external controller. The control logic 125 controls the address decoder 121, the voltage generator 122, the read/write circuit 123, and the data input/output circuit 124 in response to the command CMD.

Figure 4:
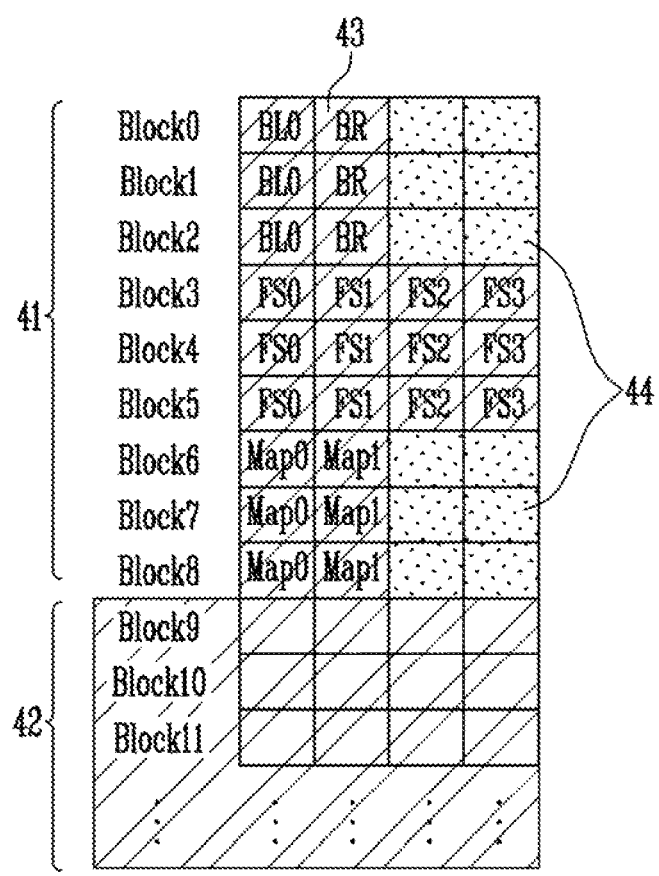
FIG. 4 is a diagram illustrating system information stored in memory blocks.

FIG. 4 is a diagram illustrating system information stored in memory blocks. The memory blocks of FIG. 4 may be memory blocks included in the memory cell array 110 described with reference to FIG. 3. Referring to FIG. 4, the memory blocks may be divided into system blocks 41 in which system information is stored and user data blocks 42 in which user data is stored.

Meanwhile, the system information may be setting information essentially required for the controller 200 of FIGS. 1-2 to control the semiconductor memory device 200 of FIGS. 1-2. The system information may be divided into host/user related information BL0 and BR, firmware related information FS0 to FS3, and mapping related information Map0 and Map1 according to their contents.

The host/user related information BL0 and BR may include booting related information and user related information. The booting related information may include boot loader related information and boot related information. The user related information may include information related to replaced protected memory block (RPMB) and permanent write protect persist within next power on (WP). The boot loader related information may include information required to execute an operating system, load a kernel into a memory, and transfer control of the memory to a host or information required to initialize hardware. The boot related information may include various hardware information, initialization information, and information related to operating system image transmission. The information related to RPMB and WP may include user's main information or secret information.

The firmware related information FS0 to FS3 may include setting information related to the semiconductor memory device as firmware system algorithms or hardware register information and FTL related information.

The mapping related information Map0 and Map1 may include at least one of map indexes (Map Index), map tables (Map T1 to T5), and map translation (Map P2L) and temporary map (Map temp P2L) information. The map indexes may include positions of the mapping relate information, and the map tables may include actual map data information of the semiconductor memory device. The map translation and temporary map information may include information between physical and logical addresses.

According to FIG. 4, the host/user related information BL0 and BR is stored in a zeroth memory block Block0, the firmware related information FS0 to FS3 is stored in a third memory block Block3, and the mapping related information Map0 and Map1 is stored in a sixth memory block Block6. Although the size of the system information is small, the system information is very important information required to drive the semiconductor memory device 100, and therefore, may be set to store a plurality of copies. In FIG. 4, it is illustrated that two backup copies are stored. That is, copies of the host/user related information BL0 and BR are stored in first and second blocks Block1 and Block2, copies of the firmware related information FS0 to FS3 are stored in fourth and fifth blocks Block4 and Block5, and copies of the mapping related information Map0 and Map1 are stored in seventh and eighth blocks Block7 and Block8.

When the erase operation of the semiconductor memory device 100 is performed in a unit of a block, if system information is updated, system information stored together with the updated system information may be erased. Therefore, in order to prevent this, system information is stored in different memory blocks as shown in FIG. 4. However, the size of the system information is not large enough to be stored in the entire one memory block, and hence the system blocks 41 may have areas 43 in which the system information is stored and empty areas 44.

Figure 5:
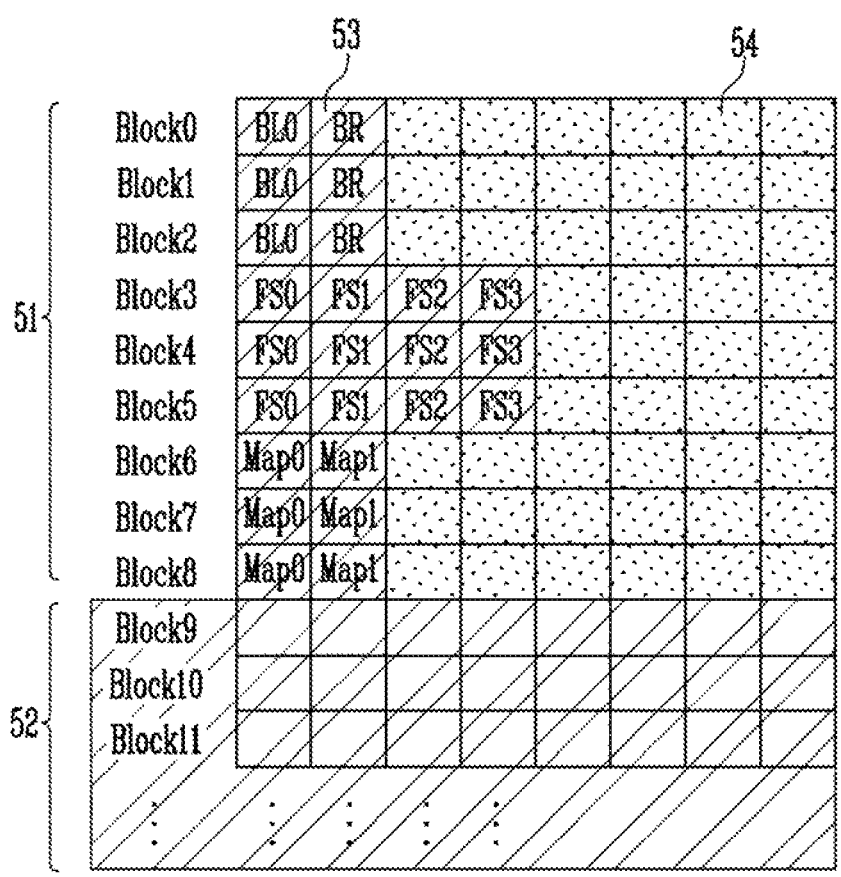
FIG. 5 is a diagram illustrating a memory cell array including memory blocks having twice the size of the memory blocks of the memory array of FIG. 4.

FIG. 5 is a diagram illustrating a memory cell array including memory blocks having twice the size of the memory blocks of the memory array of FIG. 4.

In semiconductor memory devices including NAND flash memories, memories having a high capacity of 128 Gb or more have recently been developed to improve production cost. Accordingly, a block size as a unit of the erase operation is increasing.

FIG. 5 illustrates a memory cell array including memory blocks each having a size two times greater than the memory block size of FIG. 4.

Referring to FIG. 5, the memory blocks may be divided into system blocks 51 in which system information is stored and data blocks 52 in which user data is stored. The system information stored in the memory blocks is stored identically to the system information described with reference to FIG. 4. The system blocks 51 may have areas 53 in which the system information is stored and empty areas 54.

If the block size increases, the size of the empty areas 54 in which no system information is stored among the system blocks 51 increases. The system information is stored using independent nine memory blocks (i.e., Block0-Block8). Therefore, as the block size increases, wasted memory resources increases in the system blocks.

Figures 6, 7:
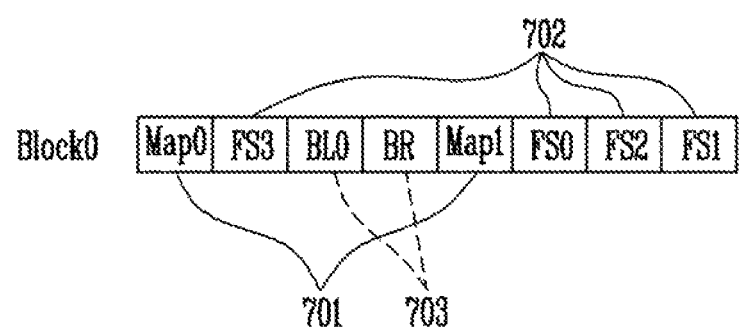
FIG. 6 is a diagram illustrating a system block according to an embodiment of the present disclosure.
FIG. 7 is a diagram illustrating a system block changing operation according to an embodiment of the present disclosure.

FIG. 6 is a diagram illustrating a system block according to an embodiment of the present disclosure.

Referring to FIG. 6, memory blocks may be divided into system blocks 61 in which system information is stored and data blocks 62 stored in which user data is stored.

In the semiconductor memory device 100 of FIGS. 1-3 according to the embodiment of the present disclosure, system information is stored in one memory block. When a portion of the system information is updated, the update is performed using a partial erase method of erasing only memory cells in a corresponding area. The system information stored in the memory blocks is stored identically to the system information described with reference to FIG. 5. The system blocks 61 have only areas 63 in which the system information is stored, and may include no wasted area.

Specifically, host/user related information BL0 and BR, firmware related information FS0 to FS3, and mapping related information Map0 and Map1 are stored in the same memory block Block0.

In FIG. 6, it is illustrated that copies of the system information are stored in first and second memory blocks Block1 and Block2, respectively. However, the number of copies and their storage positions may be changed in various embodiments.

According to the embodiment of FIG. 6, unlike FIG. 5, only three of the memory blocks are used as the system blocks, and each system block includes no empty area. Thus, user data blocks can be further secured.

FIG. 7 is a diagram illustrating a system block changing operation according to an embodiment of the present disclosure.

When system information is changed or when system information is required to be changed, the controller 200 of FIGS. 1-2 updates system information stored in a system block of the memory cell array in the semiconductor memory device. The update of the system information may be performed using a method of erasing at least one page in which the corresponding system information is stored and programming the updated system information in the erased page.

Meanwhile, repeating an operation of programming and erasing a memory cell is referred to as cycling, program/erase (PE) cycling, or erase/write (EW) cycling. Maximum numbers of cycling times may be different for every memory cell, and the maximum number of cycling times is one of indexes for determining the reliability of a memory cell.

Whether system information is updated and the frequency of the update may be changed depending on a type of the system information. Specifically, the number of cycling times of memory cells which stores the system information that are not updated or have a large number of updating times does not increase. However, the number of cycling times of memory cells in which system information such as mapping related information requiring frequent update is stored may continuously increase. Therefore, the semiconductor memory device 100 according to the embodiment of the present disclosure may perform a system block changing operation such that numbers of cycling times of memory cells in a system block are uniformly distributed.

Specifically, the controller 200 for the semiconductor memory device 100 may count a number of updating times of memory cells in a system block. If the accumulated number of updating times exceeds a threshold value, the controller 200 may perform a system block changing operation. The system block changing operation may be performed in a unit of a block or a page. When the system block changing operation is performed in the unit of the block, the system block is changed to another memory block using a wear leveling method. When the system block changing operating is performed in the unit of the page, system information stored in a page including memory cells of which the number of cycling times is large may be stored in a page including memory cells of which the number of cycling times is small.

In an embodiment, the controller 200 may control the semiconductor memory device 100 to alternate the position at which system information of which the accumulated number of updating times is large is stored and the position at which system information of which the accumulated number of updating times is small is stored.

FIG. 7 illustrates a result obtained by performing a system block changing operation on system information of the system block Block0.

Referring to FIG. 7, the system block according to the embodiment of the present disclosure stores all system information in one memory block Block0. The system information includes host/user related information BL0 and BR, firmware related information FS0 to FS3, and mapping related information Map0 and Map1.

In the system information, the accumulated number of updating times of the host/user related information BL0 and BR is smallest, and the accumulated number of updating times of the mapping related information Map0 and Map1 is largest. The accumulated number of updating times of the firmware relate information FS0 to FS3 is larger than the accumulated number of updating times of the host/user related information BL0 and BR and smaller than the accumulated number of updating times of the mapping related information Map0 and Map1.

The system information may be divided into first system information, second system information, and third system information according to accumulated number of updating times. Here, the accumulated number of updating times of the first system information may be smallest. The accumulated number of updating times of the second system information may be larger than the accumulated number of updating times of the first system information and smaller than the accumulated number of updating times of the third system information. The accumulated number of updating times of the third system information may be largest. In an embodiment, the first system information may be the host/user related information BL0 and BR, the second system information may be the firmware relate information FS0 to FS3, and the third system information may be the mapping related information Map0 and Map1.

The position at which each of the first system information 703, the second system information 702, and the third system information 701 is stored may be changed through the system block changing operation depending on number of cycling times of memory cells. The accumulated number of updating times of the system information Map0 in the mapping related information is large, and the accumulated number of updating times of the system information FS3 in the firmware related information is large. In this case, the positions of the system information Map0 and the system information FS3 are changed to the existing positions at which the host/user related information BL0 and BR was stored.

Hereinafter, the system block changing operation will be described in detail with reference to FIGS. 8 to 11.

Figure 8:
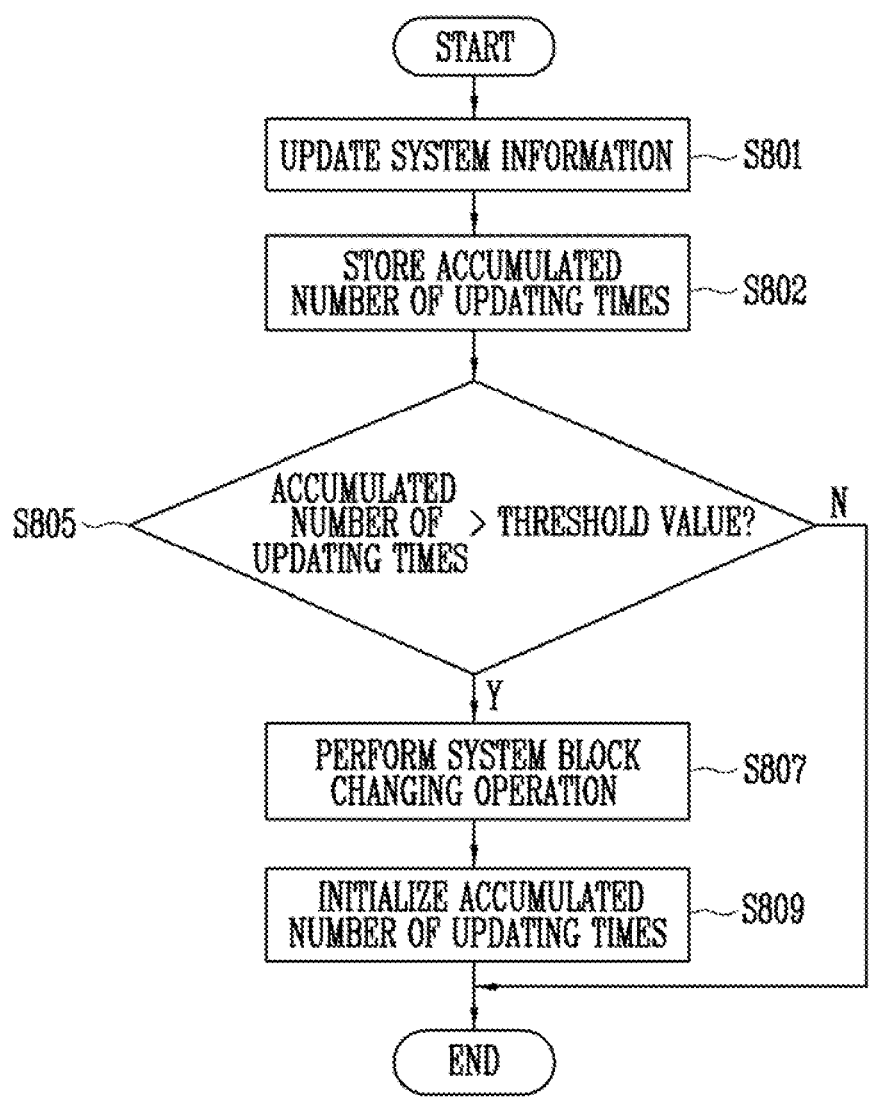
FIG. 8 is a flowchart illustrating an operation of the memory system according to an embodiment of the present disclosure.

FIG. 8 is a flowchart illustrating an operation of a memory system according to an embodiment of the present disclosure. For example, the memory system of FIG. 8 may be the memory system 10 of FIG. 1.

Referring to FIG. 8, in step S801, the memory system 10 updates system information. The update of the system information may be performed periodically or when necessary during operation of the controller 200 and the semiconductor memory device 100 of FIGS. 1-3. Specifically, when system information is changed or when system information is required to be changed, the controller 200 updates system information stored in a system block of the memory cell array in the semiconductor memory device 100. The update of the system information may be performed using a method of erasing at least one page in which the corresponding system information is stored and programming the updated system information in the erased page.

In step S802, the memory system 10 stores an accumulated number of updating times. Specifically, the controller 200 of the memory system 10 includes a counter circuit for counting a number of updating times. The controller 200 may increase the number by one each time the system information is updated. In an embodiment, the controller 200 may count a number of times of the erase operation or a number of times of the program operation. The controller 200 may count an accumulated number of updating times for each kind of the system information and store the counted accumulated number of updating times. In an embodiment, the controller 200 may store accumulated update, contents of updated system information, and address values of memory cells in which the corresponding system information is stored.

In step S805, the controller 200 of the memory system 10 determines whether the accumulated number of updating times exceeds a predetermined threshold value. If it is determined in step S805 that the accumulated number of updating times does not exceed the threshold value, the operation of the memory system 10 is finished as it is. If it is determined in step S805 that the accumulated number of updating times exceeds the threshold value, the memory system 10 proceeds to step S807.

In step S807, the memory system 10 performs a system block changing operation. The system block changing operation will be described in detail later with reference to FIGS. 10 and 11.

In step S809, the controller 200 of the memory system 10 may initialize the stored accumulated number of updating times.

In FIG. 8, it is illustrated that steps S805 and S807 are performed after the system information is updated in step S801. However, in another embodiment, steps S805 and S807 may be performed before the system information is updated in step S801. Alternatively, the system block changing operation may be independently performed regardless of the update of the system information.

Figure 9:
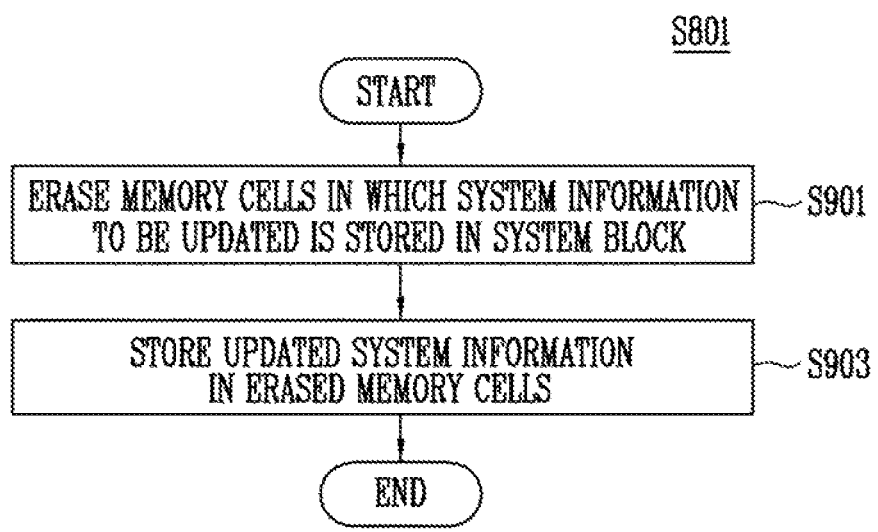
FIG. 9 is a flowchart illustrating a system information updating operation of FIG. 8.

FIG. 9 is a flowchart illustrating the system information updating operation S801 of FIG. 8.

Referring to FIG. 9, in step S901, the controller 200 controls the semiconductor memory device 100 to erase memory cells in which system information to be updated is stored in the system block of the memory cell array in the semiconductor memory device 100. When the memory cells in which the system information to be updated is stored are erased, the semiconductor memory device 100 does not erase the whole of the system block but may erase only a portion of the system block. According an embodiment, a partial erase method may be used as the method for erasing the portion of the system block.

The controller 200 may provide the semiconductor memory device 100 with an erase command and an address of memory cells to be erased through a channel. The semiconductor memory device 100 may erase system information of the corresponding address through a partial erase operation and transmit an erase result to the controller.

In step S903, the controller 200 stores updated system information in the memory cells erased in step S901. The controller 200 may provide the semiconductor memory device 100 with a program command, an address, and system information. The semiconductor memory device 100 may store the updated system information in the erased memory cells in the system block.

Figure 10:
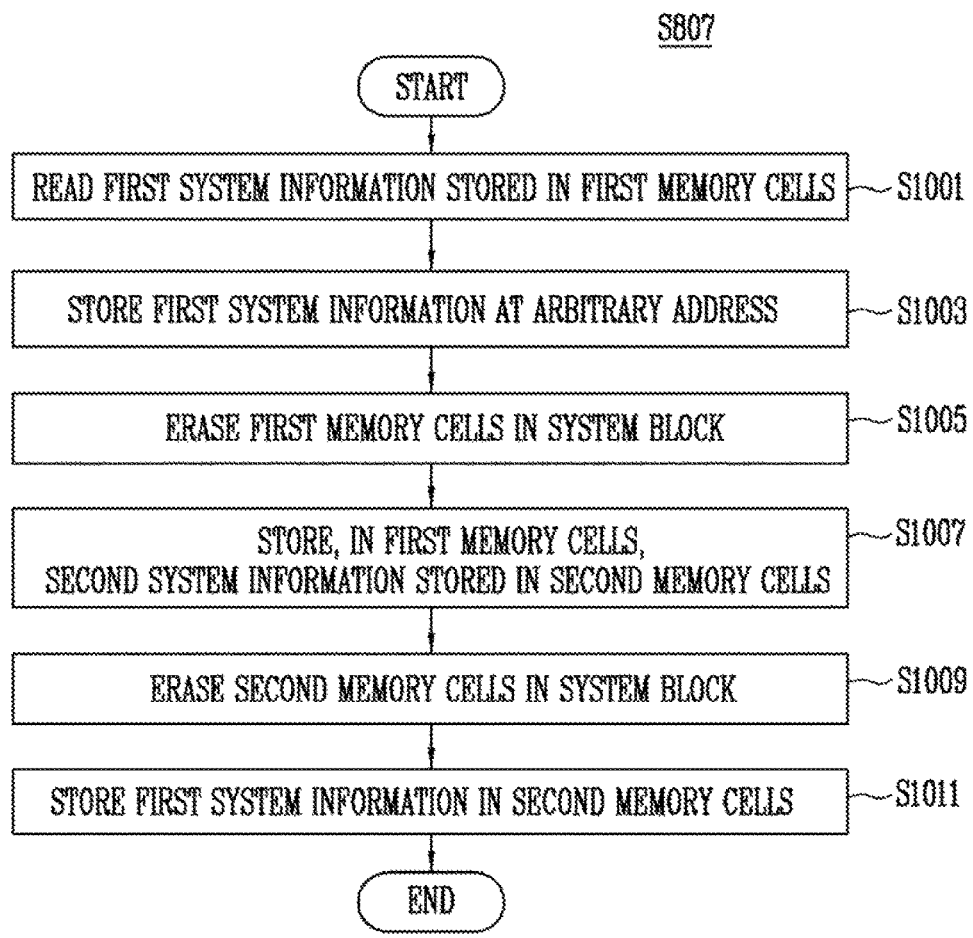
FIG. 10 is a flowchart illustrating a system block changing operation of FIG. 8.

FIG. 10 is a flowchart illustrating the system block changing operation S807 of FIG. 8.

In FIG. 10, a case where all system information is stored in one system block of the memory cell array in the semiconductor memory device 100 will be described as an example. The system information may be divided into first system information, second system information, and third system information. Here, the accumulated number of updating times of the first system information may be smallest. The accumulated number of updating times of the second system information may be larger than the accumulated number of updating times of the first system information and smaller than the accumulated number of updating times of the third system information. The accumulated number of updating times of the third system information may be largest. In an embodiment, the first system information may be the host/user related information BL0 and BR, the second system information may be the firmware relate information FS0 to FS3, and the third system information may be the mapping related information Map0 and Map1.

A case where the first system information is stored in first memory cells, the second system information is stored in second memory cells, and the third system information is stored in third memory cells will be described as an example.

FIG. 10 illustrates an embodiment in which the system block is changed in such a manner that alternates the position at which the first system information is stored and the position at which the second system information is stored. Referring to FIG. 10, in step S1001, the controller 200 reads the first system information stored in the first memory cells.

In step S1003, the controller 200 may store, at an arbitrary address, the first system information stored in the first memory cells. Here, the arbitrary address may be an address indicating a storage unit positioned in the controller. In various embodiments, the arbitrary address may be an address indicating a buffer or register in the semiconductor memory device 100. Alternatively, the arbitrary address may be an address indicating positions of arbitrary memory cells of the memory cell array in the semiconductor memory device 100.

In step S1005, the controller 200 may erase the first memory cells in the system block. In this case, the controller 200 does not erase the whole of the system block but may erase a portion of the system block. That is, the partial erase method may be used as the method for erasing the first memory cells.

In step S1007, the controller 200 may store, in the first memory cells, the second system information stored in the second memory cells. Specifically, the controller 200 may read the second system information stored in the second memory cells through a read operation and store the read data in the first memory cells.

In step S1009, the controller 200 may erase the second memory cells in the system block. In this case, the controller 200 does not erase the whole of the system block but may erase a portion of the system block. That is, the partial erase method may be used as the method for erasing the first memory cells.

In step S1011, the controller 200 stores, in the second memory cells, the first system information stored at the arbitrary address in step S1003. The storing of the first system information in the second memory cells may be performed using a method of reading the first system information stored at the arbitrary address through a read operation and storing the read first system information in the second memory cells.

According to the embodiment of FIG. 10, the position at which the first system information is stored and the position at which the second system information is stored are alternated with each other, so that it is possible to uniformly manage numbers of cycling times of the memory cells in the system block.

Figure 11:
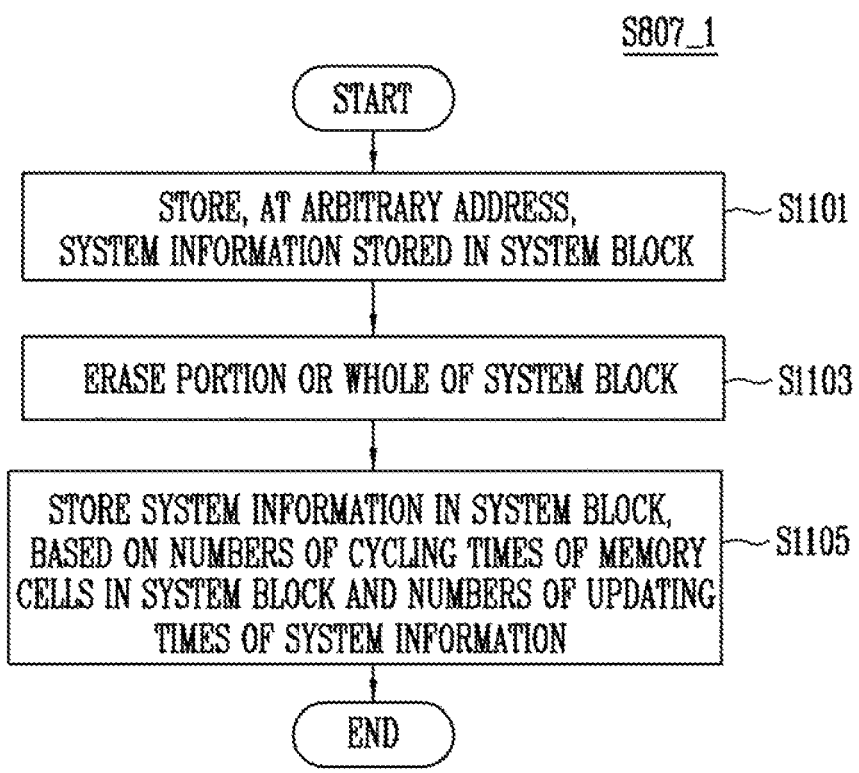
FIG. 11 is a flowchart illustrating another embodiment of the system block changing operation of FIG. 8.

FIG. 11 is a flowchart illustrating another embodiment S807_1 of the system block changing operation S807 of FIG. 8.

According to the embodiment of FIG. 11, in step S1101, the controller 200 stores, at an arbitrary address, system information stored in the system block. In an embodiment, the controller 200 reads a portion or the whole of the system information stored in the system block through a read operation and stores the read system information at an arbitrary address. Here, the arbitrary address may be an address indicating a storage unit positioned in the controller 200. In various embodiments, the arbitrary address may be an address indicating a buffer or register in the semiconductor memory device 100. Alternatively, the arbitrary address may be an address indicating positions of arbitrary memory cells of the memory cell array in the semiconductor memory device 100.

In step S1103, the controller 200 controls the semiconductor memory device 100 to erase a portion or the whole of the system block. Specifically, when only a portion of the system block is erased, the portion of the system block may be erased using the partial erase method. When the whole of the system block is erased, the whole of the system block may be erased through an ordinary erase operation.

In step S1105, the controller 200 may store the system information in the system block, based on numbers of cycling times of the memory cells in the system block and a number of updating times of the system information.

The storage unit provided in the controller 200 may store numbers of cycling times of the memory cells in the system block. The controller 200 may determine memory cells in which the system information is to be stored based on the accumulated number of updating times and control the semiconductor memory device 100 to store the system information in the determined memory cells. In this case, system information of which the accumulated number of updating times is large may be stored in memory cells of which numbers of cycling times are small. In an embodiment, when system information is stored in memory cells, the controller 200 may store updated system information in the memory cells.

Figure 12:
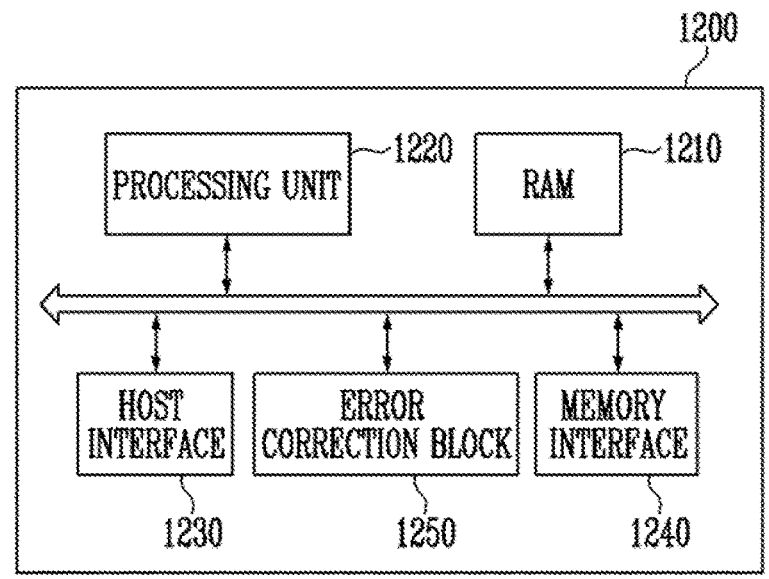
FIG. 12 is a block diagram illustrating an embodiment for implementing the controller of FIG. 1.

FIG. 12 is a block diagram illustrating an embodiment 1200 for implementing the controller 200 of FIG. 1.

Referring to FIG. 12, the controller 1200 includes a random access memory (RAM) 1210, a processing unit 1220, a host interface 1230, a memory interface 1240, and an error correction block 1250.

The processing unit 1220 controls overall operations of the controller 1200. The RAM 1210 may be used as at least one of an operation memory of the processing unit 1220, a cache memory between the semiconductor memory device (e.g., the semiconductor memory device 100 of FIGS. 1-3) and the host, and a buffer memory between the semiconductor memory device and the host. The processing unit 1220 and the RAM 1210 may perform functions of the system block setting unit 270 of FIG. 2.

The host interface 1230 may include a protocol for exchanging data between the host and the controller 1200. In an embodiment, the controller 1200 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1240 interfaces with the semiconductor memory device.

The error correction block 1250 may decode data received from the semiconductor memory device by using an error correction code.

Figure 13:
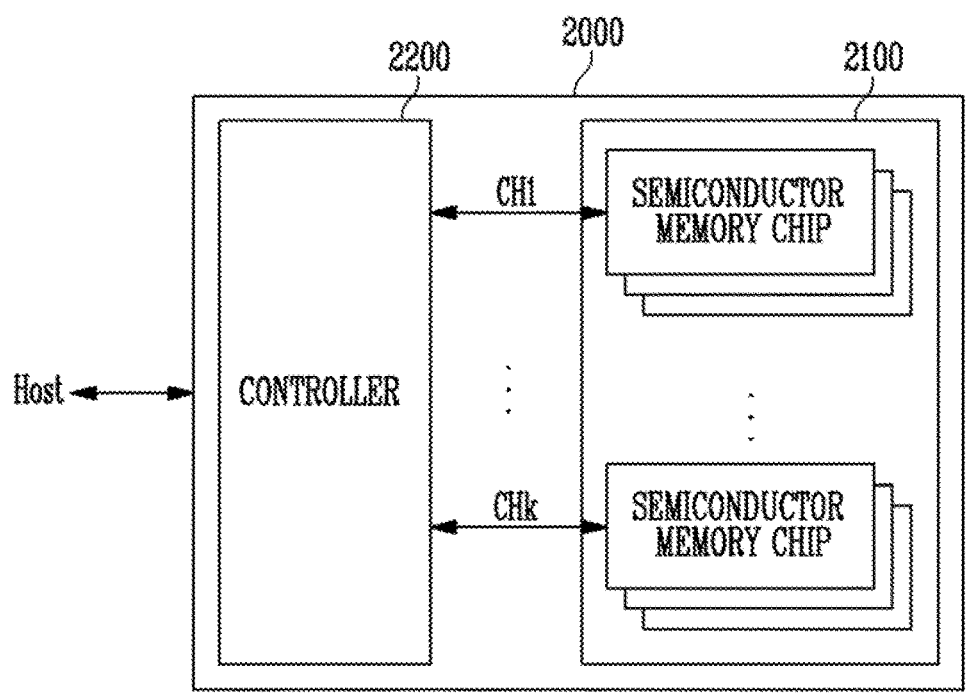
FIG. 13 is a block diagram illustrating an application example of the memory system of FIG. 1.

FIG. 13 is a block diagram illustrating an application example 2000 of the memory system 10 of FIG. 1.

Referring to FIG. 13, the memory system 2000 may include a semiconductor memory device 2100 and a controller 2200. The semiconductor memory device 2100 may include a plurality of semiconductor memory chips. The plurality of semiconductor memory chips are divided into a plurality of groups.

In FIG. 13, it is illustrated that the plurality of groups communicate with the controller 2200 through first to kth channels CH1 to CHk. Each semiconductor memory chip may be configured and operated like the semiconductor memory device 100 described with reference to FIGS. 1 and 2.

Each group is configured to communicate with the controller 2200 through one common channel. The controller 2200 is configured identically to the controller 200 described with reference to FIGS. 1-2. The controller 2200 is configured to control the plurality of memory chips of the semiconductor memory device 2100 through the plurality of channels CH1 to CHk. In FIG. 13, it is illustrated that a plurality of semiconductor memory chips are coupled to one channel. However, it will be understood that the memory system 2000 may be modified such that one semiconductor memory chip is coupled to one channel.

The controller 2200 and the semiconductor memory device 2100 may be integrated into one semiconductor device. As an exemplary embodiment, the controller 2200 and the semiconductor memory device 2100 may be integrated into one semiconductor device, to constitute a memory card. For example, the controller 2200 and the semiconductor memory device 2100 may be integrated into one semiconductor device, to constitute a memory card such as a PC card (personal computer memory card international association (PCMCIA)), a compact flash (CF) card, a smart media card (SM or SMC), a memory stick, a multimedia card (e.g., MMC, RS-MMC or MMCmicro), an SD card (e.g., SD, miniSD, microSD or SDHC), or a universal flash storage (UFS).

The controller 2200 and the semiconductor memory device 2100 may be integrated into one semiconductor device to constitute a semiconductor drive (e.g., a solid state drive (SSD)). The semiconductor drive SSD includes a storage device configured to store data in a semiconductor memory. If the memory system 2000 is used as the semiconductor drive SSD, the operating speed of the host coupled to the memory system 2000 can be remarkably improved.

As another example, the memory system 2000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

As an exemplary embodiment, the semiconductor memory device 2100 or the memory system 2000 may be packaged in various forms. For example, the semiconductor memory device 2100 or the memory system 2000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), wafer-level processed stack package (WSP), and the like.

Figure 14:
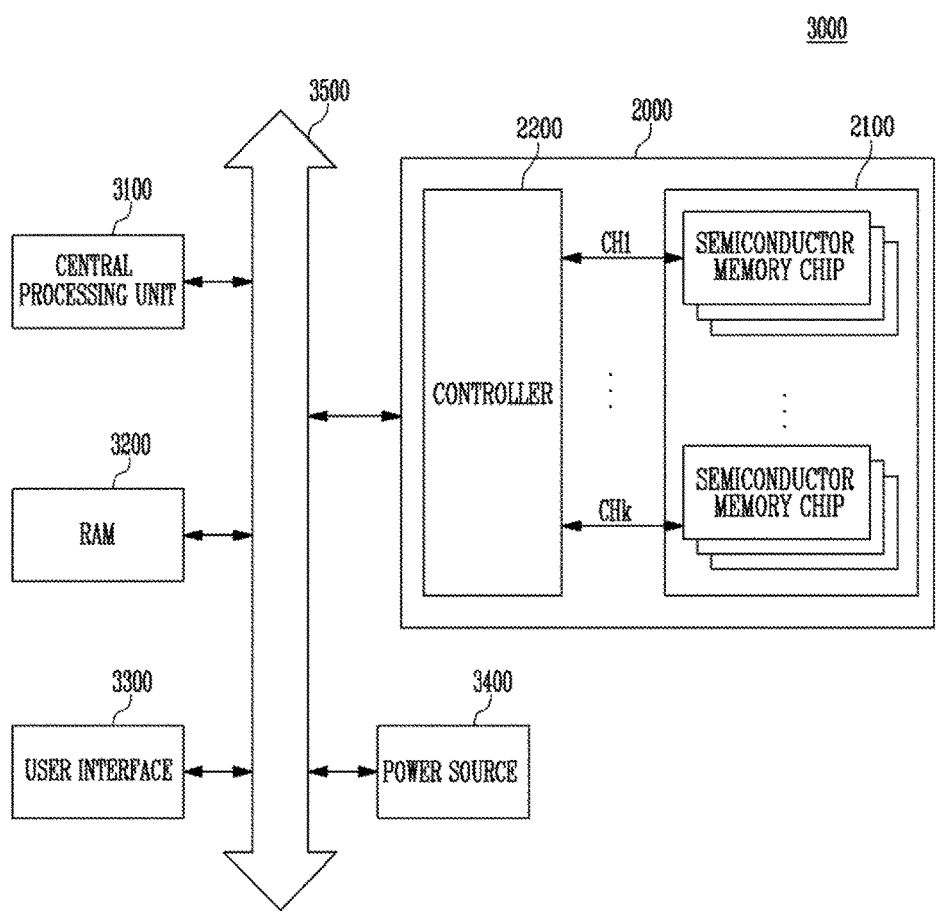
FIG. 14 is a block diagram illustrating a computing system including the memory system described with reference to FIG. 13.

FIG. 14 is a block diagram illustrating a computing system 3000 including the memory system 2000 described with reference to FIG. 13.

Referring to FIG. 14, the computing system 3000 may include a central processing unit 3100, a random access memory (RAM) 3200, a user interface 3300, a power source 3400, a system bus 3500, and the memory system 2000.

The memory system 2000 is electrically coupled to the central processing unit 3100, the RAM 3200, the user interface 3300, and the power source 3400 through the system bus 3500. Data supplied through user interface 3300 or data processed by the central processing unit 3100 are stored in the memory system 2000.

In FIG. 14, it is illustrated that the semiconductor memory device 2100 is coupled to the system bus 3500 through the controller 2200. However, the semiconductor memory device 2100 may be directly coupled to the system bus 3500. In this case, the function of the controller 2200 may be performed by the central processing unit 3100 and the RAM 3200.

In FIG. 14, it is illustrated that the memory system 2000 described with reference to FIG. 10 is provided. However, the memory system 2000 may be replaced by the memory system 10 described with reference to FIG. 1. As an exemplary embodiment, the computing system 3000 may be configured to include both the memory systems 10 and 2000 described with reference to FIGS. 1 and 13.

According to the present disclosure, it is possible to provide a semiconductor memory device having improved operation speed and an operating method thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and/or scope of the present disclosure as set forth in the following claims.

What is claimed is:

1. A memory system comprising:
a semiconductor memory device including a plurality of memory blocks; and
a controller configured to control the semiconductor memory device,
wherein the semiconductor memory device is configured to store system information in system memory blocks, and to erase a portion of the one system memory block among the system memory blocks and to update the system information stored in the portion of the one system memory block in response to a request of the controller,
wherein the system information includes a plurality of contents and the plurality of contents are stored corresponding storage positions respectively within the one system memory block,
wherein the storage positions of the plurality of contents are changed within the one system memory block according to a number of updating times of each content of the plurality of contents, and
wherein the system information includes host/user related information, firmware related information, and mapping related information.

2. The memory system of claim 1, wherein the host/user related information includes initialization related information of the controller and the semiconductor memory device and user related information including user's main information or secret information.

3. The memory system of claim 1, wherein the firmware related information includes at least one of setting information related to the semiconductor memory device, hardware register information, and flash translation layer related information.

4. The memory system of claim 1, wherein the mapping related information includes information related to a logical address provided from a host and a physical address of memory cells of the semiconductor memory device.

5. The memory system of claim 1, wherein the controller is further configured to, when the portion of the system information is updated, perform a system block configuration changing operation for changing the storage positions of the plurality of contents.

6. The memory system of claim 1, wherein the controller is further configured to store an accumulated number of updating times of the plurality of contents, respectively.

7. The memory system of claim 6, wherein, when the accumulated number of updating times for one content among the plurality of contents exceeds a predetermined threshold value, the controller is further configured to perform a system block configuration changing operation for changing the storage positions of the plurality of content.

8. The memory system of claim 7,
wherein the system block configuration changing operation is performed by changing storage positions of the one content and another content each other, and
wherein the accumulated number of updating times for the another content is smaller than the accumulated number of updating times for the one content.

9. A method of operating a memory system including a semiconductor memory device having a plurality of memory blocks and a controller for controlling the semiconductor memory device, the method comprising:
storing system information in system memory blocks among the plurality of memory blocks, wherein the system information includes a plurality of contents and the plurality of contents are stored corresponding storage positions respectively within the one memory block;
erasing a portion of one system memory block among the system blocks;
updating the system information stored in the portion of the one system memory block in response to a request of the controller; and
changing storage positions of the plurality of contents within the one system memory block according to a number of updating times of each content of the plurality of contents,
wherein the system information includes host/user related information, firmware related information, and mapping related information.

10. The method of claim 9, wherein the updating of the system information comprises
storing an accumulated number of updating times of the plurality of contents, respectively.

11. The method of claim 10, wherein the changing storage positions of the plurality of contents within the one system memory block is performed when the accumulated number of updating times exceeds a predetermined threshold value.

12. The method of claim 10, wherein the changing storage positions of the plurality of contents within the one system memory block includes:
   changing storage positions of the one content and another content each other,
   wherein the accumulated number of updating times for the another content is smaller than the accumulated number of updating times for the one content.

13. The method of claim 9, wherein the host/user related information includes initialization related information of the controller and the semiconductor memory device and user related information including user's main information or secret information.

14. The method of claim 9, wherein the firmware related information includes at least one of setting information related to the semiconductor memory device, hardware register information, and flash translation layer related information.

15. The method of claim 9, wherein the mapping related information includes information related to a logical address provided from a host and a physical address of memory cells of the semiconductor memory device.

* * * * *